United States Patent
Lee et al.

(10) Patent No.: US 8,521,104 B2
(45) Date of Patent: Aug. 27, 2013

(54) AMPLIFIER STRUCTURE AND AMPLIFICATION METHOD THEREOF

(75) Inventors: Sung Jun Lee, Daejeon (KR); Jae Ho Jung, Daejeon (KR)

(73) Assignee: Electronics and Telecommunications Research Institute, Daejeon (KP)

( * ) Notice: Subject to any disclaimer, the term of this patent is extended or adjusted under 35 U.S.C. 154(b) by 0 days.

(21) Appl. No.: 13/335,481

(22) Filed: Dec. 22, 2011

(65) Prior Publication Data

US 2012/0161864 A1    Jun. 28, 2012

(30) Foreign Application Priority Data

Dec. 23, 2010   (KR) .......................... 10-2010-0133073

(51) Int. Cl.
*H04B 1/04* (2006.01)
(52) U.S. Cl.
USPC ............................................ 455/118; 330/10
(58) Field of Classification Search
USPC ................. 455/91, 102, 110, 339, 118, 112, 455/113; 330/10, 251
See application file for complete search history.

(56) References Cited

U.S. PATENT DOCUMENTS

| | | | |
|---|---|---|---|
| 6,937,175 B1 * | 8/2005 | Cruz-Albrecht et al. ..... | 341/143 |
| 7,023,267 B2 * | 4/2006 | Lee et al. ........................ | 330/10 |
| 7,551,904 B2 | 6/2009 | Lee et al. | |
| 7,629,841 B2 * | 12/2009 | Gustat ............................ | 330/10 |
| 8,064,856 B2 * | 11/2011 | Singerl et al. .............. | 455/127.1 |
| 8,290,087 B2 * | 10/2012 | Schlee et al. .................. | 375/298 |

FOREIGN PATENT DOCUMENTS

KR     100810322 B1    3/2008

OTHER PUBLICATIONS

T. Johnson et al., Manchester encoded bandpass sigma—delta modulation for RF class D amplifiers, Circuits Devices Syst., Feb. 2007, pp. 21-26, vol. 1, Issue 1.

* cited by examiner

*Primary Examiner* — Sonny Trinh
(74) *Attorney, Agent, or Firm* — William Park & Associates Patent Ltd (57) ABSTRACT

Provided is an amplifier structure. The amplifier structure includes a delta-sigma modulator, an up converter, a power amplifier, and a band-pass filter. The delta-sigma modulator receives an IF signal to delta-sigma modulate the IF signal. The up converter up-converts a frequency of the delta-sigma modulated signal with an LO signal. The power amplifier amplifies a power of the up-converted signal. The band-pass filter filters the amplified signal of a selected band. The amplifier structure performs the delta-sigma modulation operation on an IF input signal, and thus can considerably decrease a delta-sigma modulation operation speed compared to a typical amplifier structure and moderate the specification in implementing a power amplifier.

4 Claims, 8 Drawing Sheets

AMPLIFIER STRUCTURE AND AMPLIFICATION METHOD THEREOF

CROSS-REFERENCE TO RELATED APPLICATIONS

This U.S. non-provisional patent application claims priority under 35 U.S.C. §119 of Korean Patent Application No. 10-2010-0133073, filed on Dec. 23, 2010, the entire contents of which are hereby incorporated by reference.

BACKGROUND OF THE INVENTION

The present invention disclosed herein relates to an amplifier structure and an amplification method thereof.

Linear amplifiers such as Class-A amplifiers provide an high output and high linearity, but have unsatisfied efficiency. In mobile communication systems, particularly, the efficiencies of linear amplifiers are further decreased. On the other hand, switching amplifiers such as Class-D amplifiers and Class-E amplifiers can provide high efficiency, but in the switching amplifiers, the kinds of inputs are limited to a signal having constant envelope characteristic in order for linearity to be guaranteed.

Therefore, research is being conducted on amplifier structures where linearity is guaranteed and high efficiency is obtained, as an example of which research on Class-S amplifiers are being attempted.

Figure 1:
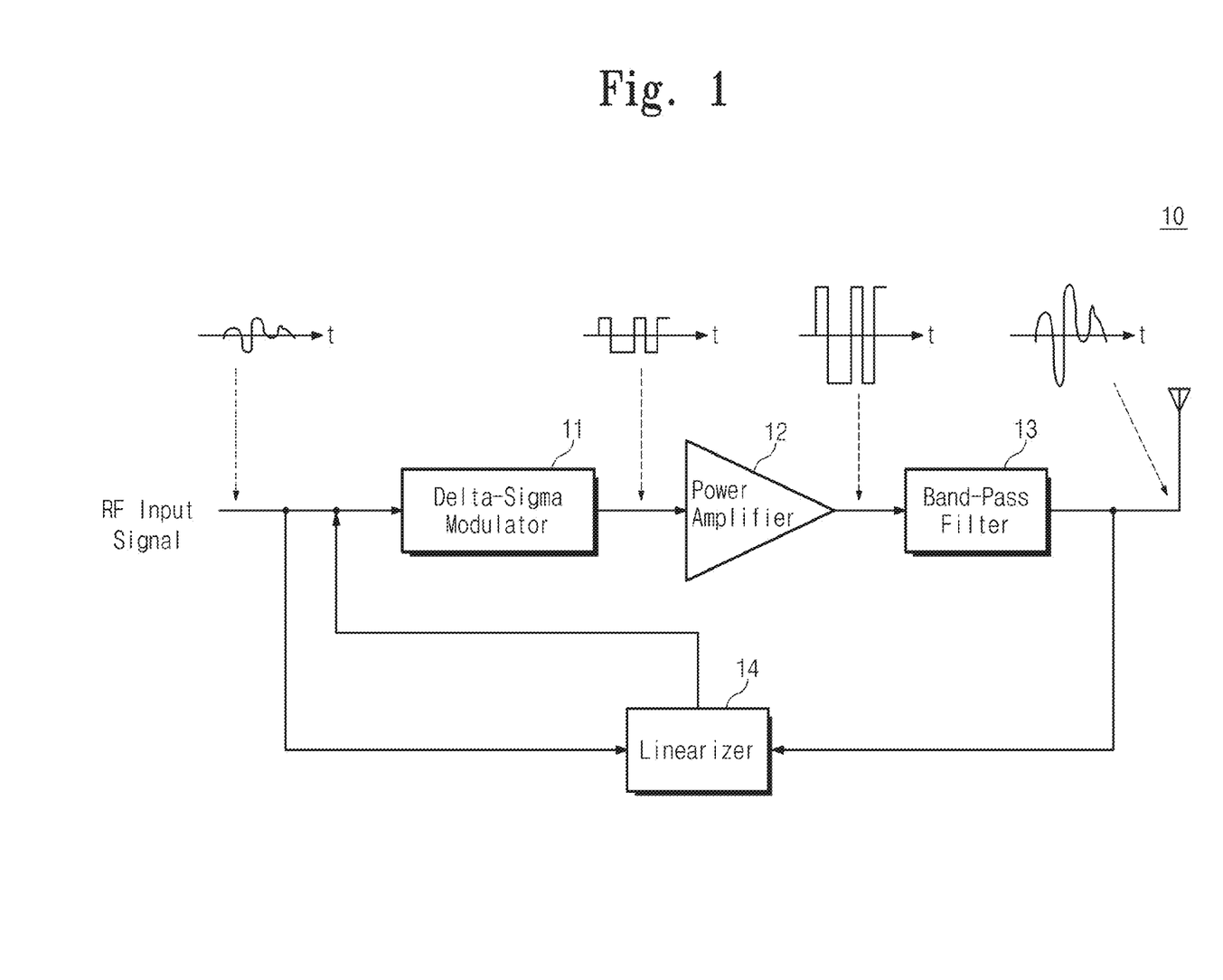
FIG. 1 is a block diagram illustrating a typical Class-S amplifier structure.

A typical Class-S amplifier structure 10 in FIG. 1 includes a delta-sigma modulator 11, a power amplifier 12, a band-pass filter 13, and a linearizer 14. The delta-sigma modulator 11 receives a Radio Frequency (RF) signal and converts the RF signal into a constant-envelope pulse signal to output the converted pulse signal to the power amplifier 12. The power amplifier 12 amplifies the received pulse signal to output the amplified pulse signal to the band-pass filter 13. The band-pass filter 13 selects only the amplified original signal from the amplified pulse signal to output the selected original signal to an antenna. The linearizer 14 corrects the nonlinear characteristic of the delta-sigma modulator 11 and the nonlinear characteristic of the power amplifier 12, in selective structure. Herein, a conversion method of converting to a constant envelope signal is limited by a signal reconstruction method corresponding to the band-pass filter 13, and the delta-sigma modulator 11 corresponds to a representative conversion method among several conversion methods.

In the typical Class-S amplifier structure 10 of FIG. 1, the delta-sigma modulator 11 is a band-pass delta-sigma modulator that receives an RF signal to operates, and generally operates at a speed higher by three times than an input center frequency. The delta-sigma modulator 11 has a limitation in that a high-speed delta-sigma modulator incapable of actual implementation is required for applying the typical Class-S amplifier structure 10 to a mobile communication service using a high RF. For example, WiMAX service using an RF of 3.5 GHz requires a delta-sigma modulator that operates at a speed higher than 10.5 GHz.

Moreover, in the typical Class-S amplifier structure 10, the power amplifier 12 is driven by the output signal of the delta-sigma modulator 11. However, since the output of the high-speed delta-sigma modulator 11 is in a wideband, it is difficult to implement the wideband input matching of the power amplifier 12 driven by the high-speed delta-sigma modulator 11.

SUMMARY OF THE INVENTION

The present invention provides a Class-S amplifier structure and an amplification method thereof, which are applied to a mobile communication system using a high RF.

Embodiments of the present invention provide an amplifier structure including: a delta-sigma modulator receiving an Intermediate Frequency (IF) signal to delta-sigma modulate the IF signal; an up converter up-converting a frequency of the delta-sigma modulated signal with a Local Oscillator (LO) signal; a power amplifier amplifying a power of the up-converted signal; and a band-pass filter filtering the amplified signal of a selected band.

In some embodiments, the amplifier structure may further include an LO signal generator generating the LO signal.

In other embodiments, the LO signal generator may output k number of pulse pairs (where k is an integer) in synchronization with a delta-sigma modulation operation of the delta-sigma modulator.

In still other embodiments, a power amplification efficiency and implementability may be controlled by selecting the up-converted Radio Frequency (RF) as "2fs+fc" or "2fs−fc". Herein, the fs may be a delta-sigma modulation speed, and the fc may be an IF.

In other embodiments of the present invention, an amplification method of an amplifier structure includes: receiving an IF signal to delta-sigma modulate the IF signal; up-converting the delta-sigma modulated signal into a signal of an RF with an LO signal; amplifying a power of the up-converted signal; and filtering the amplified signal of a selected band.

In some embodiments, the amplification method may further include generating the LO signal at an integer multiple of a delta-sigma modulation speed in synchronization with the delta-sigma modulation speed.

In other embodiments, the amplification method may further include selecting high-side injection with a frequency of the LO signal higher than the RF, or selecting low-side injection with a frequency of the LO signal lower than the RF.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 2:
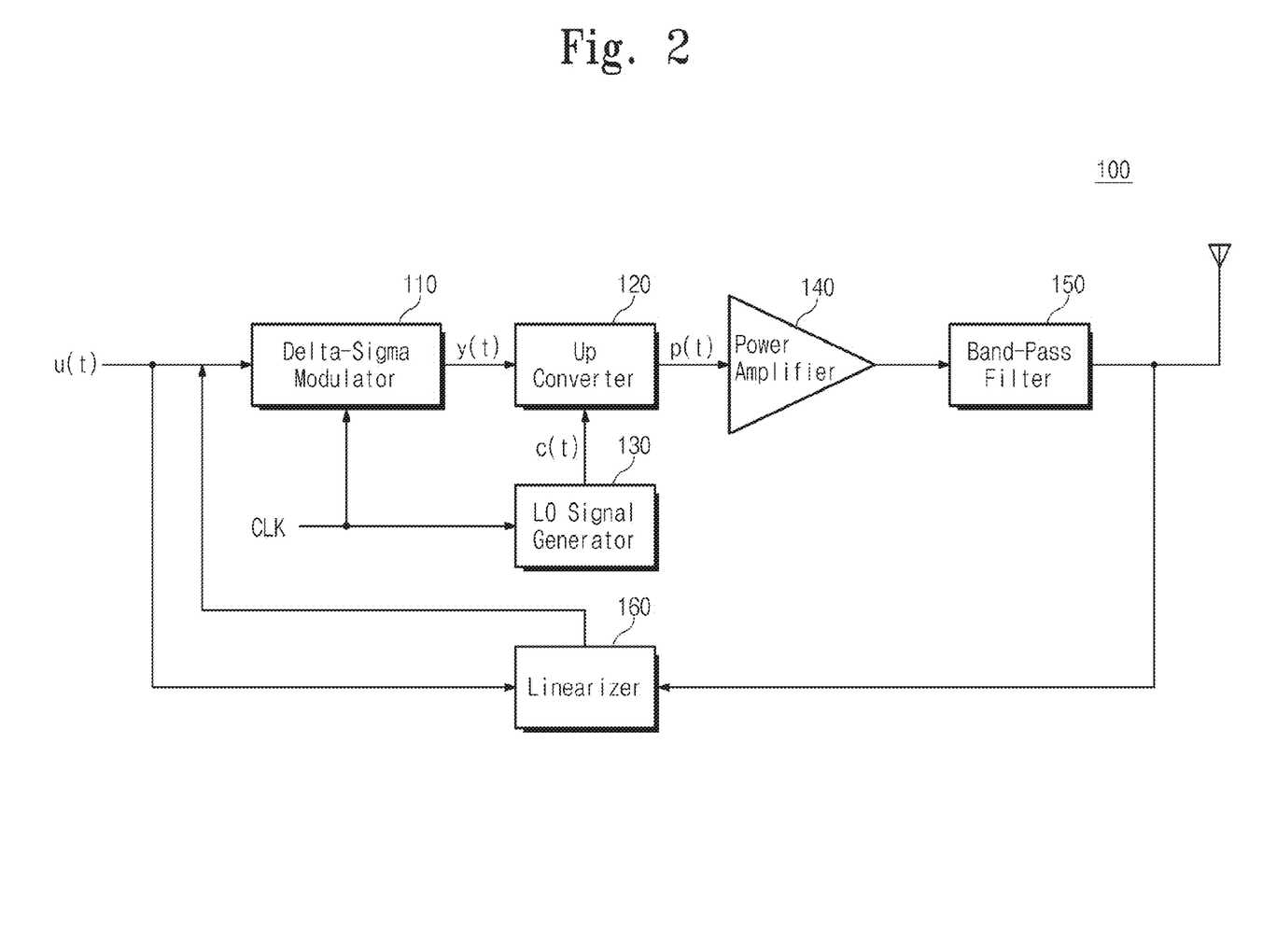
FIG. 2 is a block diagram illustrating an amplifier structure according to an embodiment of the present invention.

FIG. 2 is a block diagram illustrating a Class-S amplifier structure 100 according to an embodiment of the present invention.

Referring to FIG. 2, the amplifier structure 100 includes a Delta-Sigma Modulator (DSM) 110, an up converter 120, a Local Oscillator (LO) signal generator 130, a power amplifier 140, a band-pass filter 150, and a linearizer 160.

The delta-sigma modulator 110 receives a clock signal CLK, and delta-sigma modulates an input signal u(t) according to the received clock signal CLK. Herein, the input signal u(t) is a signal of an Intermediate Frequency (IF) band. The delta-sigma modulator 110 outputs a delta-sigma modulated signal y(t) to the up converter 120.

The LO signal generator 130 receives the clock signal CLK, and generates an LO signal c(t) according to the received clock signal CLK. The LO signal generator 130 generates the LO signal c(t) having a speed higher by an integer multiple than an delta-sigma modulation speed of the delta-sigma modulator 110. Herein, the LO signal c(t) has a signal pulse type. The LO signal generator 130 outputs the LO signal c(t) to the up converter 120.

The up converter 120 up-converts the delta-sigma modulated signal y(t) into an RF signal by using the LO signal c(t).

Herein, the delta-sigma modulated signal y(t) is a signal of an IF band, and an up-converted signal p(t) based on the LO signal c(t) is a signal of an RF band. The up converter 120 outputs the up-converted signal p(t) to the power amplifier 140.

The power amplifier 140 amplifies the up-converted signal p(t). The power amplifier 140 outputs the amplified signal to the band-pass filter 150.

The band-pass filter 150 filters only an amplified original signal from the amplified signal, and transmits the filtered signal to the outside through an antenna.

To maintain the entire linearity of a system, the linearizer 160 compensates for the nonlinear characteristic of the delta-sigma modulator 110 and nonlinear characteristic that is shown in a switching operation of the power amplifier 140. That is, the linearizer 160 compares a signal that is coupled in a rear end of the band-pass filter 150 which is for removing an out-of-band noise and a signal of a front end of the delta-sigma modulator 110, and improves the linearity of a final output signal.

The amplifier structure 100 up-converts the delta-sigma modulated signal y(t) by using the LO signal c(t), and thus can decrease an operation speed of the delta-sigma modulator 110 compared to a typical Class-S amplifier structure, decrease an input matching bandwidth, and moderate a specification of an operation speed of a switching device.

Figure 3:
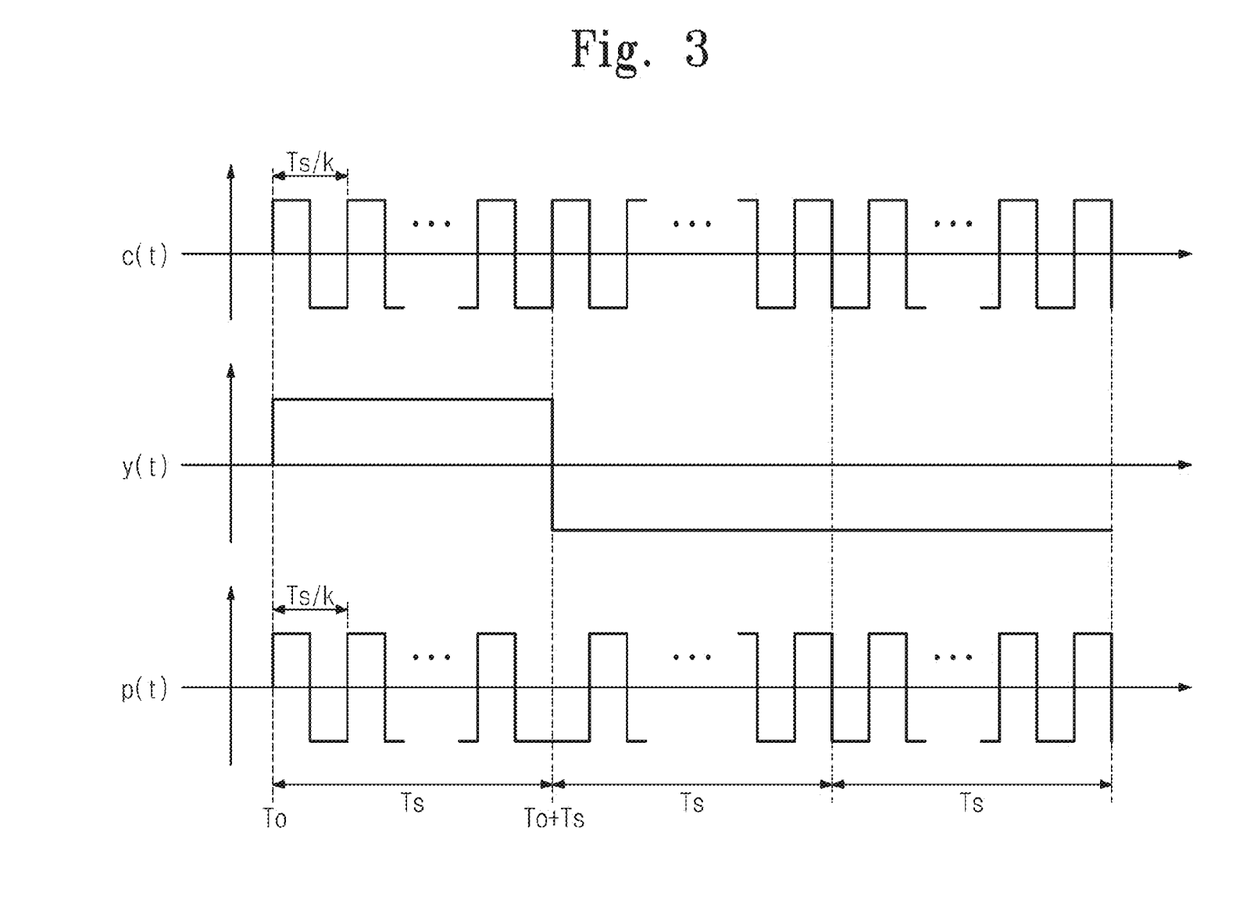
FIG. 3 is a diagram for describing an operation of an up-converter included in the amplifier structure according to an embodiment of the present invention.

FIG. 3 is a diagram for describing an operation of the up-converter included in the amplifier structure according to an embodiment of the present invention.

Referring to FIG. 3, the delta-sigma modulation signal y(t) is a constant envelope signal into which an input signal u(t) being an inconstant envelope has been modulated through delta-sigma modulation. The LO signal c(t) is synchronized with the operation speed of the delta-sigma modulator 110 (see FIG. 2), and thus, the delta-sigma modulator 110 operates once to output k number of pulse pairs. Herein, one pulse pair indicates 1 and −1. In FIG. 3, Ts indicates an inverse number of the operation speed (fs) of the delta-sigma modulator 110.

The up converter 120 (see FIG. 2) up-converts the output signal y(t) of the delta-sigma modulator 110 with the LO signal c(t). Herein, when a frequency of the LO signal c(t) is not an integer multiple of the operation speed of the delta-sigma modulator 110, distortion occurs in a spectrum of a region to be reconstructed by the band-pass filter 150 (see FIG. 2). Therefore, by outputting integer number of pulse pairs per delta-sigma modulation operation, distortion is prevented from occurring in the spectrum of the region to be reconstructed by the band-pass filter 150.

Figure 4:
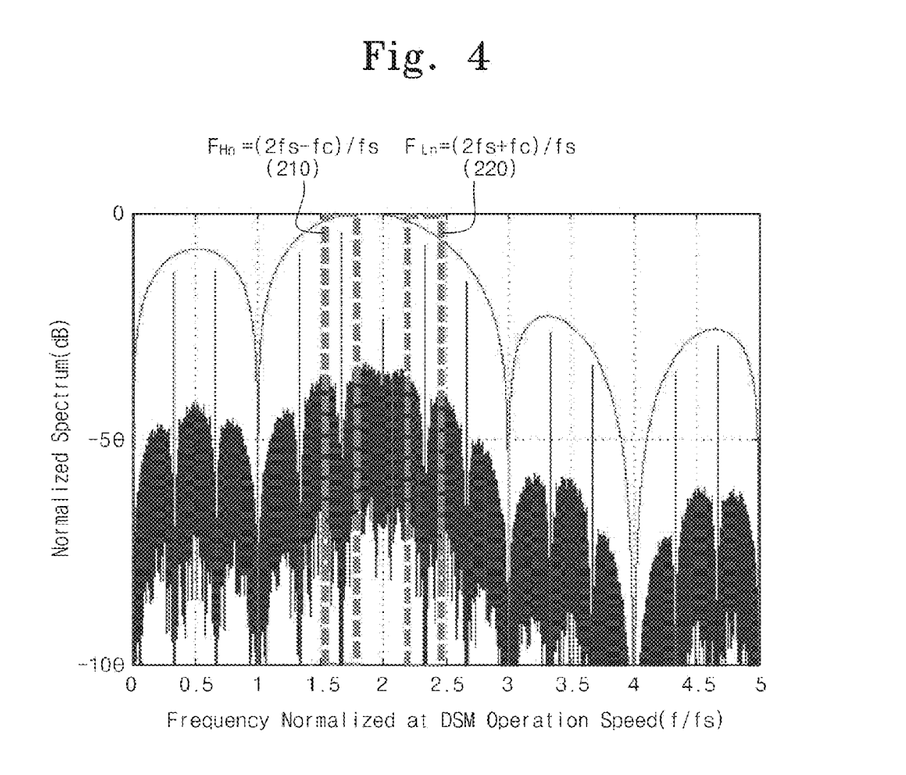
FIG. 4 is a diagram illustrating an embodiment of a frequency domain output of the up-converter included in the amplifier structure according to an embodiment of the present invention.

FIG. 4 is a diagram illustrating an embodiment of a frequency domain output of the up-converter 120 included in the amplifier structure 100 according to an embodiment of the present invention. In FIG. 4, a single tone input signal u(t) of a frequency fc, the delta-sigma modulator 110 operating at a speed higher by three times than an input center frequency, and the LO signal generator 130 outputting two pulse pairs (k=2) per delta-sigma modulation are assumed. In this case, a case of selecting an RF as "$f_H=(2fs-fc)$" is referred to as a High-Side Injection (HSI), and a case of selecting an RF as "$f_L=(2fs+fc)$" is referred to as a Low-Side Injection (LSI). The up-converted signal p(t) is amplified by the power amplifier 140 (see FIG. 1), and the band-pass filter 150 (see FIG. 1) selects only a necessary band from the amplified signal.

A drain efficiency ($\eta_d$) of a switching power amplifier may be expressed as Equation (1) below.

$$\eta_d = \frac{P_{load}}{(P_{load} + P_{insertion\_loss} + P_{conduction\_loss} + P_{switching\_loss})} \quad (1)$$

where $P_{load}$ indicates a signal power reconstructed by the band-pass filter 150, $P_{insertion\_loss}$ indicates the insertion loss of the band-pass filter 150, $P_{conduction\_loss}$ indicates loss due to an on-resistance $R_{on}$ in a switching stage, and $P_{switching\_loss}$ indicates loss due to parasitic component in the switching stage.

A coding efficiency ($\eta_p$) is a power ratio between $P_{load}$ and power that is obtained from a load ($R_L$) when there is no band-pass filter. When it is assumed that a switching stage output is a pulse of $\pm\Delta_a$, the coding efficiency ($\eta_p$) may be expressed as Equation (2) below.

$$\eta_d = \frac{P_{load}}{(\Delta_a)^2 / R_L} \quad (2)$$

Due to an up-conversion operation of the up converter 120, the coding efficiency is further reduced than before the up-conversion operation is performed. In this case, a degree of the reduction in the coding efficiency varies according to an up-conversion type (for example, HSI and an LSI).

Figure 5:
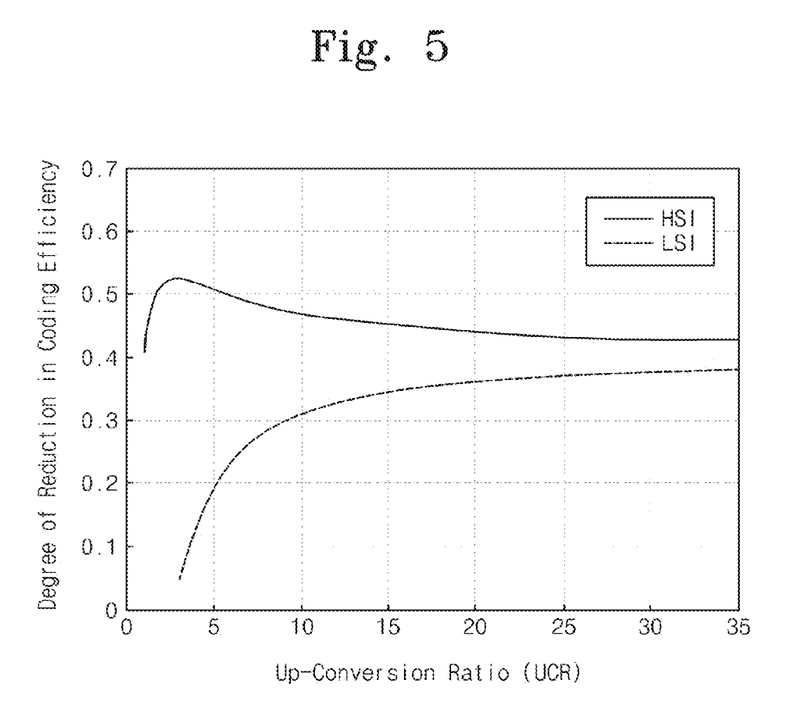
FIG. 5 is a graph showing the reduction in a coding efficiency in the output of the up converter included in the amplifier structure according to an embodiment of the present invention.

FIG. 5 is a graph showing the reduction in the coding efficiency in the output of the up converter 120 included in the amplifier structure according to an embodiment of the present invention. Herein, it is assumed that the LO signal generator 130 outputs one pulse pair (k=1) per delta-sigma modulation. The abscissa axis of the graph indicates an Up-Conversion Ratio (UCR). Herein, the up-conversion ratio denotes a ratio of a center frequency before and after up-conversion, and is expressed as Equation (3) below. The ordinate axis of the graph indicates a degree of the reduction in a coding efficiency. Referring to FIG. 5, it can be seen that a coding efficiency is less reduced in HSI than a case of using LSI.

$$UCR = \frac{f_0}{f_c} = \begin{cases} (kf_s - f_c)/f_c = (2kR_c - 1), & HSI \\ (kf_s - f_c)/f_c = (2kR_c + 1), & LSI \end{cases} \quad (3)$$

Figure 6:
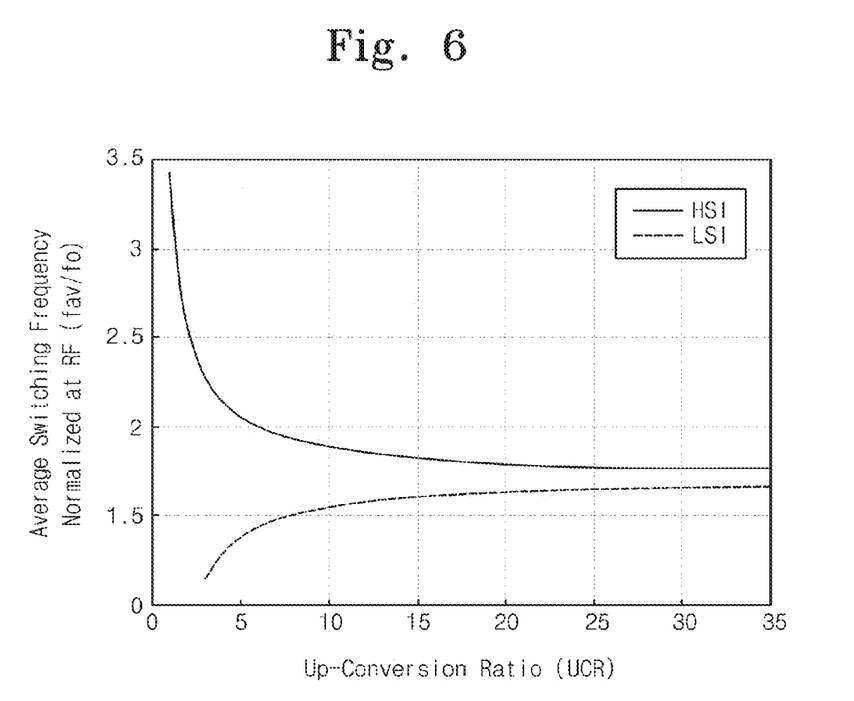
FIG. 6 is a graph showing an average switching frequency which has been normalized at an RF of a switching device driving signal in the amplifier structure according to an embodiment of the present invention.

FIG. 6 is a graph showing an average switching frequency which has been normalized at an RF of a switching device driving signal in the amplifier structure according to an embodiment of the present invention. Switching loss ($P_{switching\_loss}$) due to a parasitic component of a device may be expressed as the multiplication of loss occurring in a switching operation and the frequency of switching. Loss occurring in one-time switching operation is determined by characteristic of a switching device, and the frequency of switching is determined by signal characteristic for driving a power amplifier. FIG. 6 is a graph showing the frequency of switching. Herein, it is assumed that the LO signal generator 130 outputs one pulse pair (k=1) per delta-sigma modulation. Referring to FIG. 6, it can be seen that the frequency of switching is lower in LSI than a case of using HSI.

HSI maintains a coding efficiency, and LSI reduces switching loss. Therefore, it can be seen that excellences of HSI and LSI in drain efficiency differ according to characteristic of a switching device.

Figure 7:
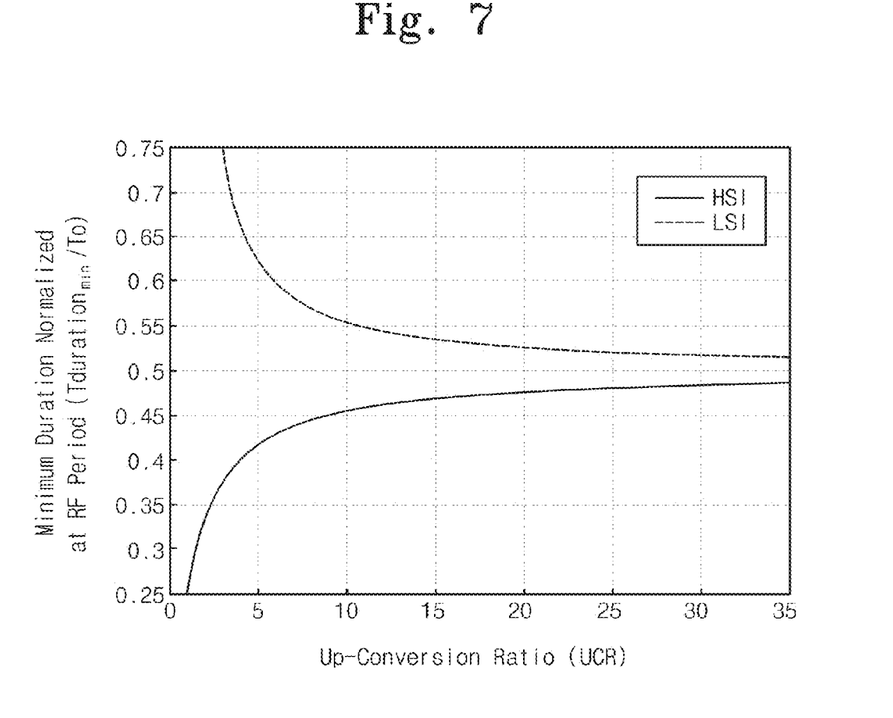
FIG. 7 is a graph showing a duration which has been normalized at an RF period of a switching device driving signal in the amplifier structure according to an embodiment of the present invention.

FIG. 7 is a graph showing a duration which has been normalized at an RF period of a switching device driving signal in the amplifier structure according to an embodiment of the present invention. A specification of a switching device configuring the power amplifier 140 is determined by the minimum duration of a pulse for driving the switching device, in which case the switching device is required to have a high specification as the minimum duration becomes shorter. FIG. 7 is a graph showing the minimum duration of the driving signal. The ordinate axis of the graph indicates the minimum duration ($T_{duration\_min}/T_o$) of a driving signal that has been normalized at an RF period. It can be seen that LSI has the minimum duration longer than HSI.

Accordingly, when efficiency of LSI is allowable although the drain efficiency of HSI is excellent, LSI may be selected based on a specification of a switching device.

Figure 8:
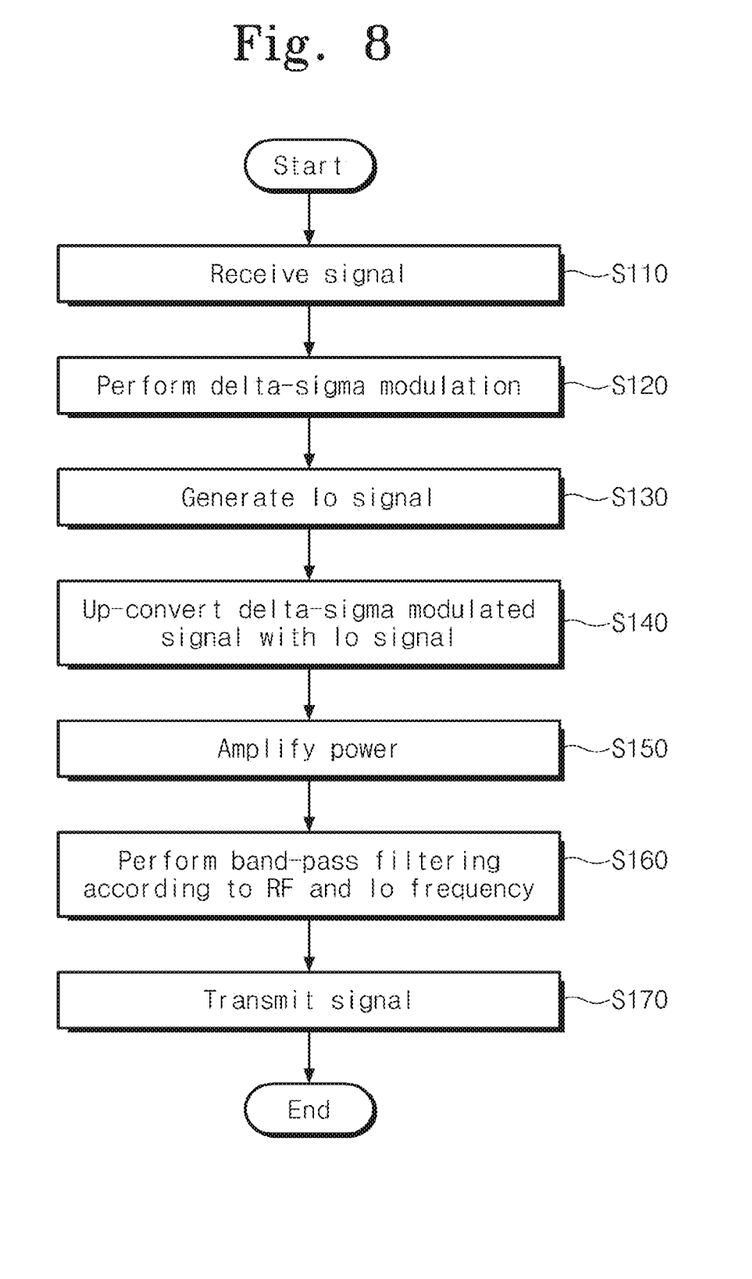
FIG. 8 is a flowchart illustrating an operation of the amplifier structure according to an embodiment of the present invention.

FIG. 8 is a flowchart illustrating an operation of the amplifier structure 100 according to an embodiment of the present invention. Referring to FIGS. 2 and 8, an operation of an amplifier is performed as follows.

The delta-sigma modulator 110 (see FIG. 2) receives the input signal u(t) in operation S110. The delta-sigma modulator 110 delta-sigma modulates the received input signal u(t) in operation S120. The delta-sigma modulator 110 outputs the delta-sigma modulated signal y(t) to the up converter 120 (see FIG. 2). The LO signal generator 130 (see FIG. 2) generates the LO signal c(t) synchronized with the operation of the delta-sigma modulator 110 in operation S130. The LO signal generator 130 outputs the LO signal c(t) to the up converter 120. The up converter 120 up-converts the delta-sigma modulated signal y(t) with the LO signal in operation S140. The up converter 130 outputs the up-converted signal p(t) to the power amplifier 140. The power amplifier 140 (see FIG. 2) amplifies the up-converted signal p(t) in operation S150. The power amplifier 140 outputs the up-converted signal p(t) to the band-pass filter 150 (see FIG. 2). The band-pass filter 150 band-pass filters the amplified signal in operation S160. The filtered signal is transmitted through the antenna in operation S170.

The amplifier structure 100 according to an embodiment of the present invention has the following effects.

First, the amplifier structure 100 performs a delta-sigma modulation operation on an IF input signal, and thus can considerably decrease a delta-sigma modulation operation speed compared to a typical amplifier structure. For example, when an IF is about 100 MHz and the delta-sigma modulator 110 operates at a 3× an input center frequency, a delta-sigma modulation operation speed is about 300 MHz.

Second, the amplifier structure 100 extends the minimum duration of a signal for driving the power amplifier 140, and thus can moderate a switching device specification of the power amplifier 140. For example, when an RF is about 3.5 GHz and the delta-sigma modulator 110 operates at 3× an RF, and when the power amplifier 140 is driven by applying HSI and LSI with an IF of about 100 MHz, the minimum duration of a driving signal is shown in Table 1.

TABLE 1

| Classification | Typical Class-S | HSI | LSI |
| --- | --- | --- | --- |
| Minimum duration of driving signal | 95.24 ps 1/(10.5 GHz) | 138.9 ps 1/(2 × 3.6 GHz) | 147.1 ps 1/(2 × 3.4 GHz) |

Third, the amplifier structure 100 decreases a maximum duration-to-minimum duration ratio in a signal for driving the power amplifier and thus the input matching of the power amplifier can becomes easier than that of a typical Class-S amplifier.

Fourth, the amplifier structure 100 considerably decreases the DC ambient low frequency power of the signal for driving the power amplifier compared to the typical Class-S amplifier structure. Accordingly, AC coupling can be used in the power amplifier.

Fifth, the amplifier structure 100 performs delta-sigma modulation on an input IF, and considers HSI and LSI where an up-conversion is performed using an LO signal synchronized with a delta-sigma modulation operation speed, thereby obtaining the optimal drain efficiency according to the switching device characteristic.

Sixth, the amplifier structure 100 considers HSI and LSI. Therefore, even when drain efficiency is worse in the LSI than the HSI, the amplifier structure 100 selects LSI, thereby moderating the specification of the switching device.

Seventh, the amplifier structure 100 uses an IF as an IF provided by a commercial base station when drain efficiency is allowable by considering HSI and LSI, and thus, the existing base station system can be used without change.

The amplifier structure and the amplification method thereof, according to embodiments of the present invention, perform the delta-sigma modulation operation on an IF input signal, and thus can considerably decrease the delta-sigma modulation operation speed compared to the typical Class-S amplifier structure.

The amplifier structure and the amplification method thereof, according to embodiments of the present invention, extend the minimum duration of the signal for driving the power amplifier, and thus can moderate the operation speed of the power amplifier compared to the typical Class-S amplifier structure.

The amplifier structure and the amplification method thereof, according to embodiments of the present invention, reduce a maximum duration-to-minimum duration ratio in the signal for driving the power amplifier, and thus, the input matching of the power amplifier becomes easier than that of the typical Class-S amplifier structure.

The amplifier structure and the amplification method thereof, according to embodiments of the present invention, considerably decrease the DC ambient low frequency power of the signal for driving the power amplifier compared to the typical Class-S amplifier structure.

The amplifier structure and the amplification method thereof, according to embodiments of the present invention, performs delta-sigma modulation on an input IF, and consider the HSI and the LSI where an up-conversion is performed using the LO signal synchronized with the delta-sigma modulation operation speed, thereby obtaining the optimal drain efficiency according to the switching device characteristic.

The amplifier structure and the amplification method thereof, according to embodiments of the present invention, consider the HSI and the LSI. Therefore, even when drain efficiency is worse in the LSI than the HSI, the amplifier structure and the amplification method select the low-side injection, thereby moderating the specification of the switching device.

The amplifier structure and the amplification method thereof, according to embodiments of the present invention, use an IF as an IF provided by the commercial base station when drain efficiency is allowable by considering the HSI and the LSI, and thus, the existing base station system can be used without change.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An amplifier structure comprising:
   a delta-sigma modulator receiving an Intermediate Frequency (IF) signal to delta-sigma modulate the IF signal;
   an up converter up-converting a frequency of the delta-sigma modulated signal using a Local Oscillator (LO) signal;
   a power amplifier amplifying a power of the up-converted signal;
   a band-pass filter filtering the amplified signal of a selected band; and
   an LO signal generator generating the LO signal,
   wherein the LO signal generator outputs k number of pulse pairs (where k is an integer) in synchronization with a delta-sigma modulation operation of the delta-sigma modulator.

2. An amplifier structure comprising:
   a delta-sigma modulator receiving an Intermediate Frequency (IF) signal to delta-sigma modulate the IF signal;
   an up converter up-converting a frequency of the delta-sigma modulated signal using a Local Oscillator (LO) signal;
   a power amplifier amplifying a power of the up-converted signal; and
   a band-pass filter filtering the amplified signal of a selected band,
   wherein a power amplification efficiency and implementability are controlled by selecting the up-converted Radio Frequency (RF) as "kfs+fc" or "kfs−fc",
   the fs is a delta-sigma modulation speed, and
   the fc is an IF.

3. An amplification method of an amplifier structure, the amplification method comprising:
   delta-sigma modulating an Intermediate Frequency (IF) signal;
   up-converting the delta-sigma modulated signal into a signal of a Radio Frequency (RF) using a Local Oscillator (LO) signal;
   amplifying a power of the up-converted signal;
   filtering the amplified signal of a selected band; and
   selecting high-side injection with a frequency of the LO signal higher than the RF, or selecting low-side injection with a frequency of the LO signal lower than the RF.

4. The amplification method of claim 3, further comprising generating the LO signal at an integer multiple of a delta-sigma modulation speed in synchronization with the delta-sigma modulation speed.

* * * * *